(12) United States Patent
LaGraff et al.

(10) Patent No.: US 6,188,919 B1
(45) Date of Patent: Feb. 13, 2001

(54) USING ION IMPLANTATION TO CREATE NORMAL LAYERS IN SUPERCONDUCTING-NORMAL-SUPERCONDUCTING JOSEPHSON JUNCTIONS

(75) Inventors: John R. LaGraff, Niskayuna, NY (US); James M. Murduck, Redondo Beach; Hugo W-K. Chan, Fremont, both of CA (US)

(73) Assignee: TRW Inc., Redondo Beach, CA (US)

( * ) Notice: Under 35 U.S.C. 154(b), the term of this patent shall be extended for 0 days.

(21) Appl. No.: 09/314,774

(22) Filed: May 19, 1999

(51) Int. Cl.[7] .................................................. H01L 29/06
(52) U.S. Cl. .................... 505/190; 505/329; 505/702; 257/31; 257/33; 257/35; 427/62
(58) Field of Search .................... 257/30, 31, 32, 257/33, 34, 35; 427/62, 63; 505/190, 329, 702, 874, 922

(56) References Cited

U.S. PATENT DOCUMENTS

| | | |
|---|---|---|
| 4,177,476 * 12/1979 | Kroger et al. | 357/5 |
| 4,536,781 8/1985 | Kroger . | |
| 5,026,682 6/1991 | Clark et al. . | |
| 5,051,396 9/1991 | Yamazaki . | |
| 5,057,491 * 10/1991 | Housley | 505/1 |
| 5,096,882 3/1992 | Kato et al. . | |
| 5,106,823 4/1992 | Creuzet et al. . | |
| 5,194,419 3/1993 | Shiga et al. . | |
| 5,229,361 7/1993 | Shiraishi et al. . | |
| 5,338,943 * 8/1994 | Wilber et al. | 505/193 |
| 5,356,870 * 10/1994 | Fujiwara et al. | 505/329 |
| 5,547,922 8/1996 | Ma . | |
| 5,552,373 * 9/1996 | Agostinelli et al. | 505/190 |
| 5,594,257 * 1/1997 | Nakamura et al. | 257/39 |
| 5,696,392 * 12/1997 | Char et al. | 257/190 |
| 5,821,557 * 10/1998 | Nagamachi et al. | 257/34 |
| 5,892,243 * 4/1999 | Chan | 257/31 |

FOREIGN PATENT DOCUMENTS 64-89571 * 4/1989 (JP) .

* cited by examiner

*Primary Examiner*—Sara Crane
(74) *Attorney, Agent, or Firm*—Michael S. Yatsko

(57) ABSTRACT

A SNS Josephson junction (10) is provided for use in a superconducting integrated circuit. The SNS junction (10) includes a first high temperature superconducting (HTS) layer (14) deposited and patterned on a substrate (18), such that the first HTS layer (14) is selectively removed to expose a top surface of the substrate (18) as well as to form an angular side surface (22) on the first HTS layer (14) adjacent to the exposed top surface of the substrate (18). Ion implantation is used to form a junction region (12) having non-superconducting properties along the angular side surface (22) of the first HTS layer (14). A second HTS layer (16) is then deposited and patterned over at least a portion of the first HTS layer (14) and the exposed top surface of the substrate (18), thereby forming a SNS Josephson junction.

26 Claims, 4 Drawing Sheets

USING ION IMPLANTATION TO CREATE NORMAL LAYERS IN SUPERCONDUCTING-NORMAL-SUPERCONDUCTING JOSEPHSON JUNCTIONS

BACKGROUND OF THE INVENTION

1. Field of the Invention

This invention relates to a superconducting-normal-superconducting (SNS) Josephson junction and, more particularly, to a method for using ion implantation to create a normal layer in an SNS Josephson junction.

2. Discussions of the Related Art

Josephson junctions are used in a variety of high temperature superconductor (HTS) integrated circuits. A Josephson junction is superconducting device capable of switching signals from one circuit to another in as little as 6 ps. Thus, Josephson junctions rely on the ability of superconducting electrons to tunnel back and forth between a first and second superconducting layer. This tunneling behavior depends on many things, including the thickness and type of the normal layer material.

To fabricate an SNS junction, a thin film of HTS material is deposited on a substrate and then patterned using photolithography techniques to create a first superconductive layer (or base electrode). An insulating dielectric layer and a second superconducting layer (or counter electrode) are formed over the first superconducting layer, and then patterned to form individual SNS junctions. The thicker the dielectric (i.e., normal layer), the more difficult it is to achieve the preferred tunneling behavior. Thus, one of the primary impediments in preparing uniform, high-quality SNS Josephson junctions is the ability to precisely control the thickness and material type of the normal layer. For instance, it is often difficult to deposit uniformly thick normal layers because uneven coverage occurs especially in the early stages of film growth. Small surface features, such as outgrowth and pores, can also inhibit uniform coating of the normal layer. Non-uniformity in the normal layer thickness or composition can lead to a poor quality junction. (e.g., electrical shorts, non-uniform tunneling, etc.).

Therefore, a method for fabricating a SNS Josephson junction addressing the above-identified problems is desirable for use in a high temperature superconductive integrated circuits.

SUMMARY OF THE INVENTION

In accordance with the teachings of the present invention, a SNS Josephson junction is provided for use in a superconducting integrated circuit. The SNS junction includes a first high temperature superconducting (HTS) layer deposited and patterned on a substrate, such that the first HTS layer is selectively removed to expose a top surface of the substrate as well as to form an angular side surface on the first HTS layer adjacent to the exposed top surface of the substrate. Ion implantation is used to form a junction region having non-superconducting properties along the angular side surface of the first layer. A second HTS layer is then deposited and patterned over at least a portion of the first HTS layer and the exposed top surface of the substrate, thereby forming a SNS Josephson junction.

BRIEF DESCRIPTION OF THE DRAWINGS

Other objects and advantages of the present invention will be apparent to those skilled in the art upon reading the following detailed description and upon reference to the drawings in which.

DETAILED DESCRIPTION OF THE PREFERRED EMBODIMENTS

While the invention is described herein with reference to illustrative embodiments for particular applications, it should be understood that the invention is not limited thereto. Those having ordinary skill in the art and access to the teachings provided herein will recognize additional modifications, applications and embodiments within the scope thereof and additional fields in which the present invention would be of significant utility.

Figure 1:
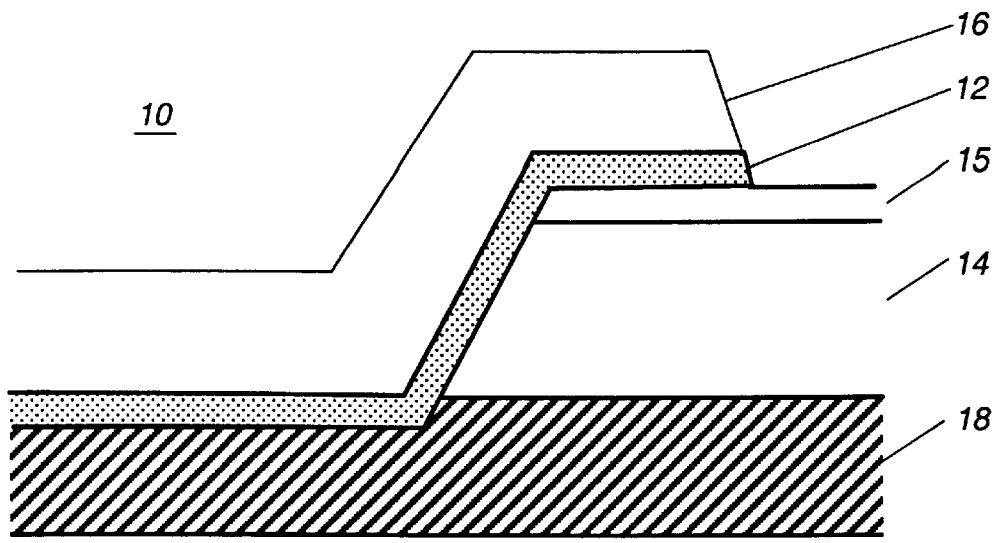
FIG. 1 illustrates a cross-sectional view of a SNS Josephson junction in accordance with the present invention.

A superconducting-normal-superconducting (SNS) junction 10 for use in a superconducting integrated circuit is depicted in FIG. 1. A thin barrier layer between superconductors through which Josephson effects are realized is known as a Josephson junction. More specifically, the Josephson effect is the tunneling of paired electrons through a thin dielectric or metallic junction region 12 separating a first high temperature superconducting (HTS) layer 14 and a second HTS layer 16.

Figure 2:
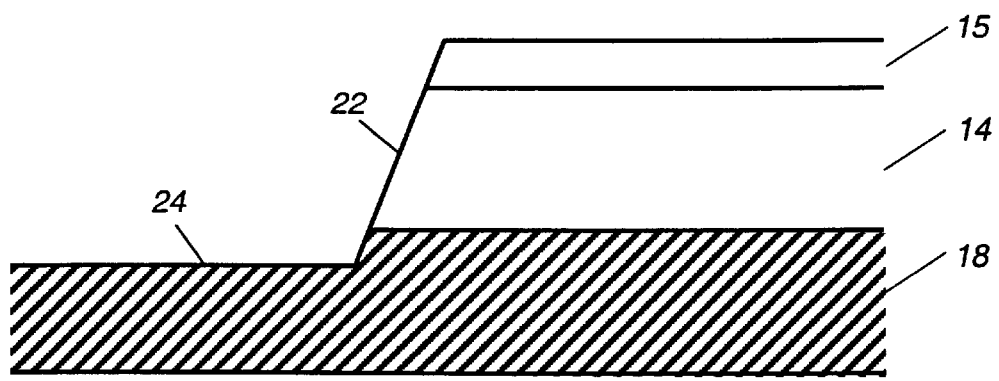
FIG. 2 illustrates a cross-sectional view of a first HTS layer and a dielectric layer being deposited on a substrate in accordance with the present invention.
Figure 3:
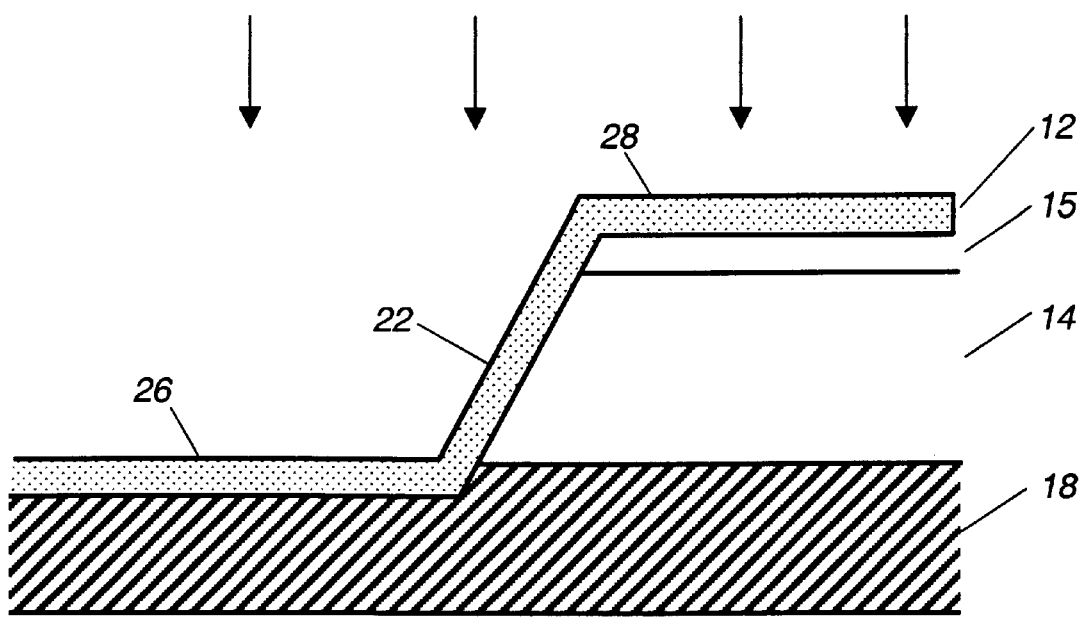
FIG. 3 illustrates a cross-sectional view of a junction region being formed using ion implantation in accordance with the present invention.
Figure 4:
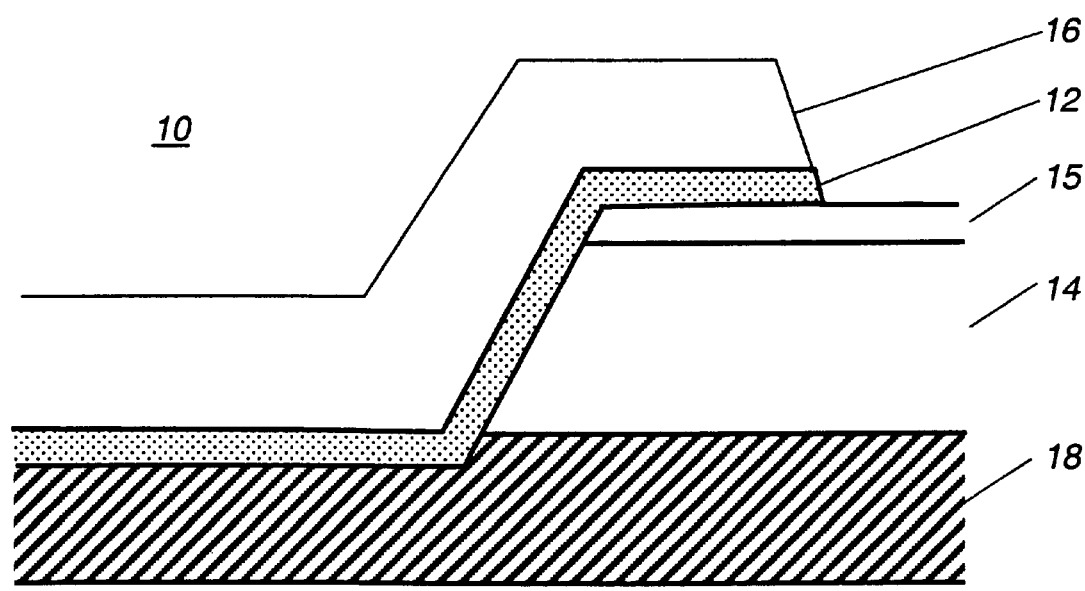
FIG. 4 illustrates a cross-sectional view of a second HTS layer deposited on the first HTS layer to form a SNS Josephson junction in accordance with the present invention.

FIGS. 2–4 illustrate the steps of a first preferred method for fabricating a SNS Josephson junction 10 in accordance with the present invention. A first HTS layer 14 having a thickness on the order of 200 nanometers is deposited on a substrate 18 using pulsed laser deposition (PLD) or other known techniques. The first HTS layer (or base electrode) 14 is preferably comprised of Yttrium-Barium-Copper-Oxygen ($YBa_2Cu_3O_7$) material. However, Bismuth-Strontium-Calcium-Copper-Oxygen (BiSrCaCuO), Thallium-Barium-Calcium-Copper-Oxygen (TlBaCaCuO), Nitrogen-Barium-Copper-Oxygen (NBaCuO), Gadolinium-Calcium-Barium-Lanthanum-Copper-Oxygen ($Gd_{0.6}Ca_{0.4}Ba_{1.6}La_{0.4}Cu_3O_7$) or other superconducting materials as will be readily apparent may also be used. A dielectric layer 15 (e.g., Strontium Titanate ($SrTiO_3$)) is optionally deposited on top of the first HTS layer to improve insulation between the first HTS layer 14 and the second HTS layer 16.

Next, the first HTS layer 14 is patterned into the structures that form the basis for a superconducting integrated circuit. FIG. 2 illustrates a fragmentary cross-sectional view of an integrated circuit. An angular side surface 22 of the first HTS layer 14 adjacent to an exposed top surface 24 of the substrate 18 will serve as the junction region 12 for SNS junction 10. To form this structure, unwanted portions of the first HTS layer 14 are physically etched using a variety of techniques. As can be appreciated, ion milling, reactive ion etching, plasma etching, wet etching as well as other etching and liftoff techniques may be used.

Ion implantation is then used to alter superconducting properties along the junction region 12 as shown in FIG. 3. The crystal lattice structure of junction region 12 must be maintained so that the second HTS layer 16 can be deposited and patterned thereon. Converting the junction region 12 to non-superconducting by using ion implantation which damages the crystal lattice is unacceptable. Therefore, the ion implant species (e.g., silicon, berylium, nickel, cobalt, calcium, gallium, ect.) are selected to change the chemical and electrical properties of the junction region 12 without interrupting the lattice structure. Such ion implantation is further disclosed in U.S. Pat. No. 5,194,419 to Shiga et al which is hereby incorporated by reference.

The dose and type of ion will control the type of normal layer formed along junction region 12. Furthermore, the average penetration depth for ion implantation depends on the acceleration energy of the implanted ion. For instance, a low acceleration energy causes shallow implants, whereas a high acceleration energy causes deep implants. Thus, the energy controls the thickness of the junction region 12 which is preferably on the order of 10–30 nanometers.

As can be appreciated, a photoresist/mask (not shown) can be used during ion implantation to delineate the altered junction region 12 from the other unaltered regions of the circuit. Preferably, ion implantation alters the angular side surface 22 of the first HTS layer 14 as well as a first area 26 on the exposed top surface of the substrate and a second area 28 on the top surface of the first HTS layer 14 (both of which are adjacent to the angular side surface 22). The photoresist/mask is removed before depositing the second HTS layer 16.

After implantation, the second HTS layer 16 (i.e., the counter electrode) with a thickness on the order of 250 nanometers is deposited using PLD or other well known techniques. Referring to FIG. 4, the second HTS layer 16 is then patterned using the previously described techniques to form SNS junction 10. When the SNS junction 10 is cooled below the transition temperature (Tc), the first and second HTS layers 14 and 16 become superconducting, whereas the junction region 12 remains an insulating dielectric or metallic material (i.e., a normal layer). One skilled in the art will readily recognize from such discussions, that the other types of materials and different thicknesses may be used to construct the SNS junction 10.

Depending on the application, a second dielectric layer (not shown) may be deposited over the second HTS layer 16 to further insulate the SNS junction 10, or a metallic layer (e.g., silver or gold material) may be deposited on the second HTS layer 16 to establish an electrical contact with the SNS junction 10. Annealing can also be performed either before or after the step of depositing and patterning the second HTS layer 16. Annealing is used to remove ion implant damage, to activate chemical bonding between the implant species and oxygen in the junction region 12, and to minimize out-diffusion of implanted dopant from the junction region 12 to the other unaltered HTS regions.

Figure 5:
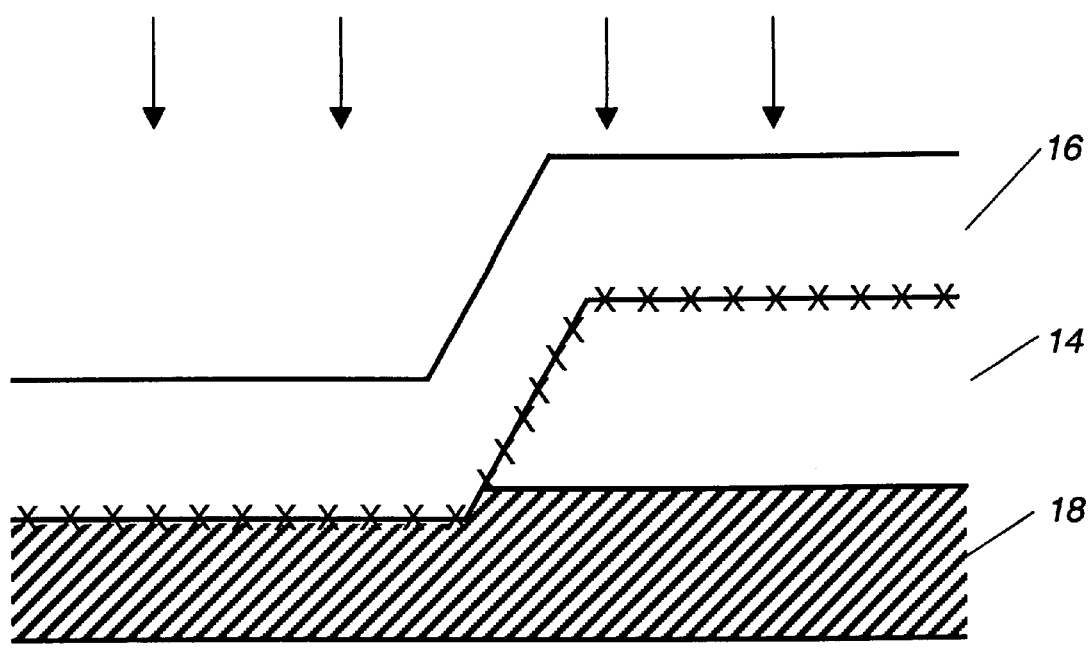
FIG. 5 illustrates a cross-sectional view of a SNS junction where thermally driven boundary diffusion of ion implants is used to form a junction in accordance with the present invention.
Figure 6:
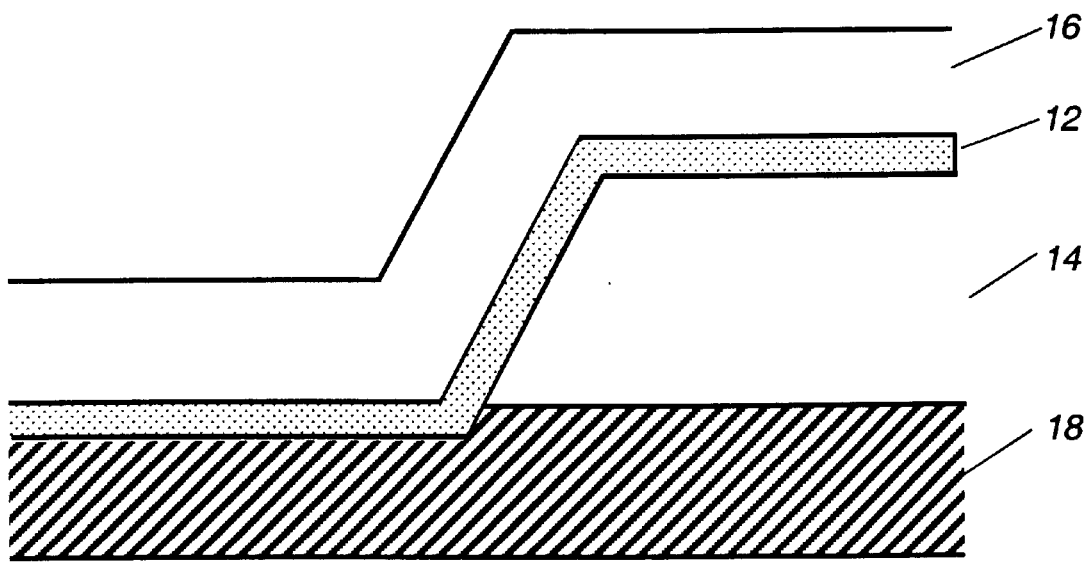
FIG. 6 illustrates a cross-sectional view of a SNS junction in accordance with a second preferred embodiment of the present invention.

A second preferred method of the present invention employs thermally driven boundary diffusion to form the SNS Josephson junction 10. In FIG. 5, ion implantation occurs after a second HTS layer 16 has been deposited on to the first HTS layer 14. It is well known in the art that the diffusion rate of ions is many orders of magnitude faster along grain boundaries than in the bulk of the material. Thus, the implanted ions will diffuse into the boundary between the first and second HTS layer 14 and 16, thereby forming a normal layer. A high temperature anneal (e.g., 400–500° C. in oxygen for $YBa_2Cu_3O_7$ material) is required to diffuse the ions. Annealing should occur while the second HTS layer 16 remains unetched, but patterned and with sealed edges, as shown in FIG. 6. Note that the annealing temperature may vary depending on the implant species and HTS material that is used to form the junction.

Figure 7:
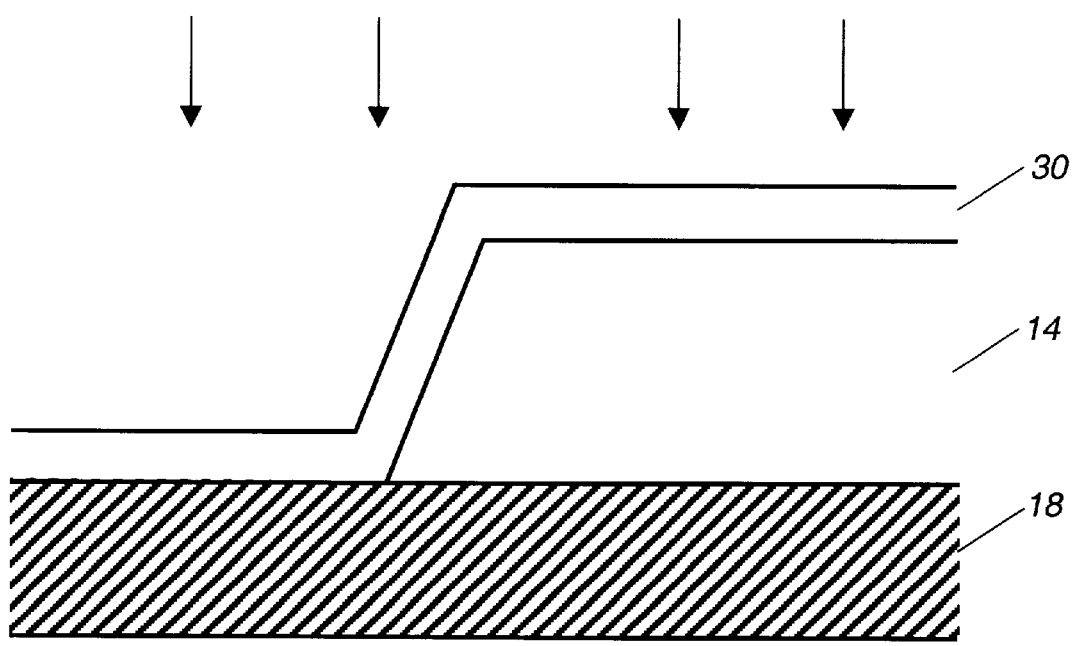
FIG. 7 illustrates a cross-sectional view of an implantation enhancement layer being used to form a junction region in accordance with the present invention.

In a third preferred method of present invention, an implantation enhancement (IE) layer is used to facilitate formation of the SNS junction 10. Generally, this method employs the same steps as any of the above described methods. However, after the first HTS layer 14 is etched away to form the angular side surface 22 of the junction, an IE layer 30 having a thickness on the order of 10–30 nanometers is deposited onto the top surface of the device as shown in FIG. 7. The IE layer 30 has the effect of concentrating the implant species, thereby transforming it into an effective normal layer for the SNS junction 10.

Figure 8:
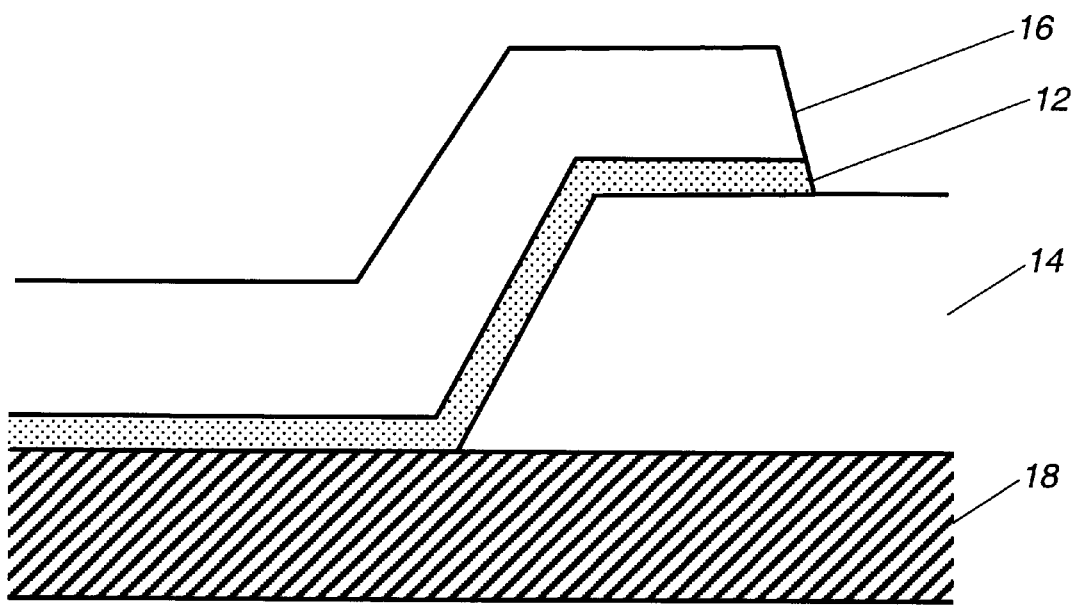
FIG. 8 illustrates a cross-sectional view of a SNS junction in accordance with a third preferred embodiment of the present invention.

The IE layer may be formed from a Cobalt doped Yttrium-Barium-Copper-Oxygen material when the first and second HTS layers 14 and 16 are comprised from Yttrium-Barium-Copper-Oxygen material, or from a Yttrium-Barium-Copper-Oxygen material when the first and second HTS layers 14 and 16 are comprised from Neodymium-Barium-Copper-Oxygen or Gadolinium-Calcium-Barium-Lanthanum-Copper-Oxygen material. Generally, the material used for IE layer 30 exhibit: (1) a high stopping power for the implant species, (2) a large chemical affinity for the implant species, and/or (3) a large diffusivity for the implant species in relation to the HTS material of the first and second HTS layers 14 and 16. As will be apparent to one skilled in the art, other types and combinations of materials also fall within the scope of the present invention. Once the junction region 12 has been formed, remaining steps from either of the above methodologies are performed to complete the formation of the SNS junction 10 illustrated in FIG. 8.

The foregoing discloses and describes merely exemplary embodiments of the present invention. One skilled in the art will readily recognize from such discussion, and from the accompanying drawings and claims, that various changes, modifications and variations can be made therein without departing from the spirit and scope of the present invention.

What is claimed is:

1. A method for fabricating a superconducting-normal-superconducting (SNS) junction for use in a superconducting integrated circuit, comprising the steps of:

depositing a first high temperature superconducting (HTS) layer on a substrate;

selectively removing a portion of said first HTS layer to expose a portion of the top surface of a substrate and to form an angular side surface on said first HTS layer adjacent to the exposed top surface of said substrate;

performing ion implantation along said angular side surface to form a junction region having non-superconducting properties; and depositing a second HTS layer on said junction region and the exposed top surface of said substrate, thereby forming the SNS junction.

2. The method of claim 1 wherein the step of performing ion implantation further comprises using a photoresist mask to delineate said junction region, said junction region being defined as said angular side surface, a first area on the exposed top surface of said substrate adjacent to said angular side surface, and a second area on the top surface of said first HTS layer adjacent to said angular side surface.

3. The method of claim 1 further comprising using an ion species selected from the group consisting of silicon, berylium, nickel, cobalt, calcium, and gallium.

4. The method of claim 1 further comprising forming said junction region having a thickness on the order of 10 to 30 nanometers.

5. The method of claim 1 wherein said first HTS layer and said second HTS layer being comprised of a material selected from the group consisting of Yttrium-Barium-Copper-Oxygen, Bismuth-Strontium-Calcium-Copper-Oxygen, Thallium-Barium-Calcium-Copper-Oxygen, Neodymium-Barium-Copper-Oxygen, and Gadolinium-Calcium-Barium-Lanthanum-Copper-Oxygen.

6. The method of claim 1 further comprising depositing a dielectric layer on the top surface of said first HTS layer after selectively removing a portion of said first HTS layer.

7. The method of claim 6 wherein said dielectric layer being comprised of strontium titanate material.

8. The method of claim 1 further comprising the step of depositing an implantation enhancement layer after selectively removing a portion of said first HTS layer, said implantation enhancement layer being deposited on the top surface of said first HTS layer and said substrate for concentrating ion implants in said implantation enhancement layer.

9. The method of claim 8 wherein said implantation enhancement layer being comprised of a material selected from the group consisting of Yttrium-Barium-Copper-Oxygen and Cobalt doped Yttrium-Barium-Copper-Oxygen.

10. The method of claim 8 wherein said implantation enhancement layer having a thickness on the order of 10 to 30 nanometers.

11. The method of claim 1 further comprising the step of annealing the SNS junction prior to the step of depositing a second HTS layer.

12. The method of claim 1 further comprising the step of annealing the SNS junction after the step of depositing a second HTS layer.

13. A method for fabricating a superconducting-normal-superconducting (SNS) junction for use in a superconducting integrated circuit, comprising the steps of:
depositing a first high temperature superconducting (HTS) layer on a substrate;
selectively removing a portion of said first HTS layer to expose a portion of the top surface of a substrate and to form an angular side surface on said first HTS layer adjacent to the exposed top surface of said substrate;
depositing a second HTS layer on a portion of said first HTS layer and the exposed top surface of said substrate;
performing ion implantation along said angular side surface to form a junction region; and
annealing to diffuse the ion implants along said angular side surface between said first HTS layer and said second HTS layer, thereby forming said junction region having non-superconducting properties.

14. The method of claim 13 wherein the step of performing ion implantation further comprises using an ion species selected from the group consisting of silicon, berylium, nickel, cobalt, calcium, and gallium.

15. The method of claim 13 wherein said junction region having a thickness on the order of 10 to 30 nanometers.

16. The method of claim 13 wherein said first HTS layer and said second HTS layer being comprised of a material selected from the group consisting of Yttrium-Barium-Copper-Oxygen, Bismuth-Strontium-Calcium-Copper-Oxygen, Thallium-Barium-Calcium-Copper-Oxygen, Neodymium-Barium-Copper-Oxygen, and Gadolinium-Calcium-Barium-Lanthanum-Copper-Oxygen.

17. The method of claim 13 further comprising depositing a dielectric layer on the top surface of said first HTS layer after selectively removing a portion of said first HTS layer.

18. The method of claim 17 wherein said dielectric layer being comprised of Strontium Titanate material.

19. The method of claim 13 further comprising the step of depositing an implantation enhancement layer after selectively removing a portion of said first HTS layer, said implantation enhancement layer being deposited on the top surface of said first HTS layer and said substrate for concentrating ion implants in said implantation enhancement layer.

20. The method of claim 19 wherein said implantation enhancement layer being comprised of a material selected from the group consisting of Yttrium-Barium-Copper-Oxygen and Cobalt doped Yttrium-Barium-Copper-Oxygen.

21. The method of claim 19 wherein said implantation enhancement layer having a thickness on the order of 10 to 30 nanometers.

22. A superconducting-normal-superconducting (SNS) junction formed on a substrate for use in a superconducting integrated circuit, comprising;
a first HTS layer deposited on the substrate, said first HTS layer being selectively removed to expose a portion of the top surface of said substrate and to form an angular side surface on said first HTS layer adjacent to the exposed top surface of said substrate;
a second HTS layer deposited and patterned over at least a portion of the top surface of said first HTS layer and the exposed top surface of the substrate; and a junction region having non-superconducting properties and being formed along said angular side surface using ion implantation.

23. The SNS junction of claim 22 wherein said junction region having a thickness on the order of 10 to 30 nanometers.

24. The SNS junction of claim 22 wherein an ion species for performing ion implantation being selected from the group consisting of Yttrium-Barium-Copper-Oxygen and Cobalt doped Yttrium-Barium-Copper-Oxygen.

25. The SNS junction of claim 22 wherein a photoresist mask is used during ion implantation to delineate said junction region, said junction region being defined as said angular side surface, a first area on the exposed top surface of said substrate adjacent to said angular side surface, and a second area on the top surface of said first HTS layer adjacent to said angular side surface.

26. The SNS junction of claim 22 wherein said first HTS layer and said second HTS layer being comprised of a material selected from the group consisting of Yttrium-Barium-Copper-Oxygen, Bismuth-Strontium-Calcium-Copper-Oxygen, Thallium-Barium-Calcium-Copper-Oxygen, Neodymium-Barium-Copper-Oxygen, and Gadolinium-Calcium-Barium-Lanthanum-Copper-Oxygen.

* * * * *